United States Patent [19]

Cordani

[11] Patent Number: 5,017,267

[45] Date of Patent: May 21, 1991

[54] COMPOSITION AND METHOD FOR STRIPPING TIN OR TIN-LEAD ALLOY FROM COPPER SURFACES

[75] Inventor: John L. Cordani, Waterbury, Conn.

[73] Assignee: MacDermid, Incorporated, Waterbury, Conn.

[21] Appl. No.: 554,126

[22] Filed: Jul. 17, 1990

[51] Int. Cl.$^5$ .......................... B44C 1/22; C23F 1/02; C03C 15/00; C03C 25/06

[52] U.S. Cl. .......................................... 156/656; 134/3; 156/664; 156/902; 252/79.4; 252/79.5; 252/142

[58] Field of Search .............. 156/656, 633, 664, 634, 156/666, 902; 252/79.2, 79.3, 79.4, 79.5, 142, 148, 146, 149; 134/2, 3, 41

[56] References Cited

U.S. PATENT DOCUMENTS

| | | | |
|---|---|---|---|
| 3,677,949 | 7/1972 | Brindisi et al. | 252/79.4 |
| 3,926,699 | 12/1975 | Dixon | 156/3 |
| 3,990,982 | 11/1976 | Dixon | 252/79.3 |
| 4,004,956 | 1/1977 | Brindisi | 156/666 |
| 4,297,257 | 10/1981 | Elias et al. | 260/29.6 H |
| 4,306,933 | 12/1981 | Da Fonte, Jr. | 156/644 |
| 4,374,744 | 2/1983 | Kawanabe et al. | 252/79.4 |
| 4,397,753 | 8/1983 | Czaja | 252/79.3 |
| 4,424,097 | 1/1984 | Lipka et al. | 156/656 |
| 4,439,338 | 3/1984 | Tomaiuolo et al. | 252/79.1 |
| 4,673,521 | 6/1987 | Sullivan et al. | 252/79.3 |
| 4,687,545 | 8/1987 | Williams et al. | 156/651 |
| 4,713,144 | 12/1987 | Schiller | 156/656 |
| 4,919,752 | 4/1990 | Mika | 156/656 |
| 4,921,571 | 5/1990 | Kukanskis et al. | 156/656 |
| 4,944,851 | 7/1990 | Cordani et al. | 204/106 |
| 4,957,653 | 9/1990 | Cordani | 252/142 |

Primary Examiner—William A. Powell
Attorney, Agent, or Firm—St. Onge Steward Johnston & Reens

[57] ABSTRACT

An aqueous composition for stripping tin or solder, as well as any underlying copper-tin alloy, from copper surfaces, containing an alkane sulfonic acid, preferably methane sulfonic acid, ferric nitrate, and a source of chlorate ion. The composition effects stripping without any appreciable formation of sludge or precipitate or suspended particles, and the chlorate component enables significant reduction in the concentration of alkane sulfonic acid otherwise needed for the stripping. Also described are stripping compositions containing a source of chlorate ion and an acid for solubilizing stripped tin or tin-lead, such as alkane sulfonic acid, acetic acid, formic acid and the like.

22 Claims, No Drawings

COMPOSITION AND METHOD FOR STRIPPING TIN OR TIN-LEAD ALLOY FROM COPPER SURFACES

BACKGROUND OF THE INVENTION

The present invention relates to compositions and methods for the stripping of tin or tin-lead alloys (i.e., solder) from a copper metal surface, and more particularly to compositions and methods for treating tin-coated or solder-coated copper surfaces in the manufacture of printed circuit boards to strip the tin or solder therefrom and expose the underlying copper metal.

In the course of manufacturing printed circuit boards, it is commonplace to deposit (e.g., by electroplating, immersion or other like processes) a layer of tin or tin-lead alloy (solder) on all or selected conductive copper surfaces of the board defining traces, through-holes, surrounding pad areas and the like, to serve, for example, as an etch resist in the subsequent etching away of other copper surfaces. By the same token, it is necessary to eventually strip the tin or tin-lead alloy from all or selected copper surfaces coated therewith, as is needed for example when it is desired to plate certain copper surfaces (e.g., contact fingers) with nickel and/or gold to improve conductivity, or when it is desired to apply a solder mask over bare copper surfaces (SMOBC processes), or when it may be necessary simply to treat a reject piece in an effort to recover and re-use the underlying copper material. Also, while particularly apropos of printed circuit board manufacture, the need to strip away tin or tin-lead layers from copper surfaces also arises in other contexts where tin or tin-lead has been applied over a copper surface for decorative and/or functional purposes.

In addition, when copper metal surfaces are coated with tin or tin-lead alloys, a thin layer or film of copper-tin alloy (or intermetallic) typically forms at the layer interface, which film progressively increases in thickness with time. Accordingly, in processes designed to strip away the tin or tin-lead layer to expose copper metal, it is necessary to insure that this copper-tin intermetallic also is removed.

Compositions designed to strip tin and/or tin-lead coatings from copper surfaces are known in the art. One class of such compositions includes those based upon hydrogen peroxide and hydrofluoric acid or a fluoride. See, e.g., U.S. Pat. Nos. 3,926,699; 3,990,982; 4,297,257; 4,306,933; 4,374,744 and 4,673,521. Another class involves those employing nitro-substituted aromatic compounds as a principal ingredient, often in conjunction with an inorganic acid (see, e.g., U.S. Pat. Nos. 3,677,949; 4,004,956; and 4,397,753) or an organic acid (see U.S. Pat. No. 4,439,338 disclosing the use of alkylsulfonic acids). Other known stripper compositions and processes are described in U.S. Pat. No. 4,424,097 and 4,687,545. Nitric acid-based strippers also have long been used in the art. See, e.g., the discussion in U.S. Pat. No. 4,713,144, and the use therein of a composition of nitric acid, sulfamic acid and ferric nitrate. See also U.S. Pat. No. 4,919,752 relating to nitric acid-based strippers.

Difficulties arise with all these known stripper compositions. The peroxide-fluoride system is very exothermic and, unless the solution is cooled continuously, temperatures are quickly reached where the peroxide decomposes. Also, the system is highly aggressive, running risk of attack on the copper and, as a result of the fluoride, attack of the glass typically present in the glass-reinforced substrates (e.g., epoxy-glass) used in printed circuit manufacture. Still a further problem with the use of peroxide-fluoride systems in the stripping of tin-lead alloys is the formation of a large volume of lead fluoride sludge which eventually interferes with stripping, requires frequent cleaning of tanks and equipment, and poses significant waste disposal problems.

Strippers based upon nitro-substituted aromatic compounds are prone to redeposition of tin onto the copper from the stripping bath, which can be difficult to remove without excessive attack on the copper, and also are plagued by sludge formation. Nitric acid-based strippers form large volumes of sludge which, apart from the above-noted problems, can become adhered to the surfaces of the copper or to the printed circuit board substrate. Still further, most such systems require two-step processing in order to insure removal of copper tin intermetallic residing on the copper surface after first removal of tin or tin-lead.

The formation of sludges and the highly corrosive nature of many of these stripper solutions also generally limits their practical use to processes where the surfaces to be treated are dipped or immersed in the solution, i.e., they are incompatible with the equipment which would be used to apply the solutions by a spraying technique.

In U.S. Pat. No. 4,957,653, the disclosure of which is incorporated herein by reference, there are described improved compositions for the stripping of tin or tin-lead alloy, as well as any underlying copper-tin alloy, from a copper surface, the compositions being comprised of an aqueous solution of an alkane sulfonic acid and ferric nitrate. Also incorporated herein by reference are the disclosures of related U.S. Pat. Nos. 4,944,851 and 4,921,571, directed, respectively, to electrolytic means for regenerating such alkane sulfonic acid/ferric nitrate compositions and to the inclusion in such compositions of inhibitors which minimize attack on the underlying copper surface. Among the outstanding advantages associated with these alkane sulfonic acid/ferric nitrate compositions is their ability to rapidly remove tin or tin-lead, and any underlying copper-tin alloy, from copper surfaces in a single application process (e.g., either immersion or spraying) without concomitant formation of any appreciable sludge or precipitate.

As further experience has been gained with stripping compositions of this type, certain less than optimally desirable characteristics have been noted, not the least of which is the relatively high cost of the composition, particularly attributable to the relatively high cost of alkane sulfonic acids, e.g., methane sulfonic acid. It has also been noted that in situations where the compositions are used to strip tin or tin-lead from copper surfaces on substrates also having organic materials, such as printed circuit substrates having a pattern of organic resist thereon, there is a tendency for the stripping composition to dissolve and undercut the resist.

SUMMARY OF THE INVENTION

The primary object of the present invention is to provide a composition for stripping tin or tin-lead alloy, as well as any underlying copper-tin alloy, from a copper surface, which composition effects such stripping rapidly, and preferably in a single application, without any appreciable formation of sludge or precipitate, and which composition has the further characteristics of being capable of relatively low-cost formulation and minimal attack on organic surfaces such as resists.

A more specific object of the invention is to provide an alkane sulfonic acid/ferric nitrate stripping composition possessing all the foregoing advantages.

Yet another more general object of the present invention is to provide compositions of enhanced performance in the stripping of tin or tin-lead from copper surfaces.

In accordance with the specific aim and object of the invention, it has been found that compositions comprised of an aqueous solution of an alkane sulfonic acid, ferric nitrate, and a source of chlorate ion can be formulated which possess all the outstanding advantages of the basic alkane sulfonic acid/ferric nitrate systems for stripping tin or tin-lead from copper, but at significantly lower cost and minimized attack on organic surfaces; indeed, these compositions also exhibit improved resistance to attack of the underlying copper surfaces.

In particular, the inclusion of a source of chlorate ion in the composition enables a significant reduction in the amount of alkane sulfonic acid which would otherwise be required in a composition without the chlorate source, while maintaining all the desirable attributes of the basic alkane sulfonic acid/ferric nitrate system, e.g., rapid stripping rate, significantly long useful operating life (i.e., high per volume capacity for stripped metals), and operation without any significant formation of sludge or precipitates. The ability to reduce the alkane sulfonic acid content in the composition provides opportunity for significant overall cost reduction, inasmuch as sources of the included chlorate ion are less expensive per se and need be used only in comparatively small amounts in order to achieve the desired results. Still further, the chlorate-containing compositions can generally be utilized at lower operating temperatures than is possible for the basic alkane sulfonic acid/ferric nitrate system; this capability, particularly when coupled with reduced alkane sulfonic acid content, is at least in part responsible for the additional finding that the compositions of the invention exhibit minimized undercutting of organic resists and minimal attack on the copper substrate. In turn, this can lead to further cost reductions owing to the possibility of elimination or reduction in inhibitor components which typically are included to minimize copper attack.

In the preferred embodiment of the invention, then, a composition is provided comprised of an aqueous solution of alkane sulfonic acid, ferric nitrate and a source of chlorate ion, with concentrations of the alkane sulfonic acid ranging within the amounts previously taught for the basic alkane sulfonic acid/ferric nitrate system, e.g., anywhere from about 10 to about 1500 grams per liter (based on grams of anhydrous alkane sulfonic acid). In other words, advantages are realized even in the expedient of inclusion of a source of chlorate ion in otherwise fully operable and effective alkane sulfonic acid/ferric nitrate systems. In the most preferred embodiment of the invention, however, the concentration of alkane sulfonic acid is substantially reduced from its optimally effective amounts in an alkane sulfonic acid/ferric nitrate system. At these substantially reduced concentrations, the basic system would otherwise exhibit greatly reduced stripping ability and low capacity for dissolved metals, but the inclusion of the chlorate brings about restoration of optimal stripping effectiveness and capacity, with the further advantages of reduced cost, reduced operating temperature capability, reduced undercutting of organic resists and reduced copper attack.

As a result of the work which has led to the findings described herein with regard to the advantages of including chlorate ion in an alkane sulfonic acid/ferric nitrate stripper composition, it has also been discovered that useful compositions for stripping tin or tin-lead from copper can be obtained by combination in aqueous solution of a source of chlorate ion and any acid component effective in solubilizing the stripped metals, e.g., alkane sulfonic acid, acetic acid, formic acid or the like. Compositions of this type, although less preferred than the earlier discussed alkane sulfonic acid/ ferric nitrate/chlorate strippers, generally can be formulated at relatively low cost and such that effectiveness in tin or tin-lead stripping is achieved in the absence of significant formation of sludge or precipitate, and with minimal undercutting of copper or organic resists.

DETAILED DESCRIPTION OF THE INVENTION

In accordance with the invention, compositions and processes are provided for stripping tin or tin-lead (solder) from copper surfaces, as well as stripping from the copper surface any copper-tin alloy which has there formed.

As previously noted, compositions of this type are particularly useful in the environment of printed circuit board manufacture where copper circuitry on an insulating substrate has been provided with a tin or tin-lead layer (e.g., by immersion plating, electroplating, etc.) incident to the manufacturing process, but then is required to be removed from all or some of the copper surfaces as a further step in manufacture and/or simply in an effort to reclaim copper from a reject board. Generally, the tin or tin-lead layer over the copper will be on the order of 0.0002 to 0.0004 inches thick (0.2 to 0.4 mils) in typical circuit board manufacturing processes. Moreover, a thin layer or film of copper-tin alloy or intermetallic will form between the copper and the tin or tin-lead layers, generally having a thickness of about 0.002 to about 0.004 mils, which thickness increases with time. The invention is generally applicable, however, to the removal of tin or tin-lead, and any underlying copper-tin alloy, from any copper surface on which the tin or tin-lead has previously been applied, whether or not in the context of printed circuit board manufacture and whether or not the copper in turn is associated with some underlying insulating or conductive substrate.

The invention is applicable to the treatment of copper surfaces on which essentially pure tin metal has been deposited or, as is more common, copper surfaces on which tin-lead alloy has been deposited. Tin-lead alloys are interchangeably referred to herein as solder, and may range in tin content from about 1 to 99% by weight, with the balance lead, although most solders commercially employed have a weight ratio of tin:lead of about 60:40. Many such alloys also contain relatively minor amounts of additional metallic species which do not in any event affect the efficacy of the stripping compositions of the invention.

According to the preferred embodiment of the invention, the essential components of the stripper composition are an alkane sulfonic acid, ferric nitrate and a source of chlorate ion, all in aqueous solution.

The alkane sulfonic acid for use in the preferred embodiment of the present invention is selected from any one or more compounds having the formula $RSO_3H$, where R is a lower alkyl group having from 1 to 5 carbon atoms, and preferably 1 or 2 carbon atoms, i.e., methane sulfonic acid or ethane sulfonic acid, with methane sulfonic acid most preferred.

The concentration of alkane sulfonic acid employed in the aqueous composition will in part depend upon the thickness of tin or tin-lead deposit being removed, the particular alkane sulfonic acid employed, the conditions of operations and, in particular, the concentration of chlorate utilized. As a general matter, the alkane sulfonic acid can be present in the aqueous composition in an amount ranging anywhere from about 10 to about 1500 g/l based on the anhydrous acid, more typically from about 10 to about 500 g/l. As noted, one of the key features of the invention is the ability to formulate the composition such that an effective stripper can be obtained at alkane sulfonic acid concentrations significantly lower than would be required, for achieving generally similar results, in compositions without chlorate. For example, an optimally effective alkane sulfonic acid/ferric nitrate stripper composition containing about 540 g/l of 70% methane sulfonic acid can be reformulated using only about 270 g/l 70% methane sulfonic acid with inclusion of 40 g/l sodium chlorate while maintaining optimal effectiveness as well as attaining other advantages (reduced temperature operation, minimized resist undercut, minimized copper attack). Thus, for the most preferred compositions according to the invention, the concentration of alkane sulfonic acid (anhydrous basis) preferably will be in the range of from about 10 to about 1500 g/l, more preferably in the range of from about 50 to about 750 g/l, and most preferably from about 200 to about 500 g/l.

Ferric nitrate is available commercially in a variety of concentrated aqueous solutions (e.g., 45% anhydrous ferric nitrate) or as hydrated crystals. Typically, the amount of ferric nitrate employed in the stripper composition is expressed in terms of anhydrous ferric nitrate, and will range from about 1 g/l up to saturation in the composition, preferably from about 3 g/l to about 150 g/l, and most preferably from about 30 g/l to about 60 g/l.

The chlorate ion source employed in the compositions according to the invention can be, for example, any solution-soluble salt of chloric acid, with sodium chlorate being preferred by reason of its cost and availability. Because of the relatively strong oxidizing nature of the stripper composition, solution-soluble chlorides (e.g., sodium chloride, ammonium chloride, hydrochloric acid, potassium chloride, and the like) also can be employed in most systems as sources of chlorate ion, relying on the in situ oxidation of chloride to chlorate.

The concentration of the chlorate ion source in the composition is substantially dependent upon the concentration of alkane sulfonic acid, i.e., from a basis alkane sulfonic acid/ferric nitrate system of given effectiveness, as the alkane sulfonic acid concentration therein is reduced, the chlorate ion concentration generally will be increased for provision of essentially equivalent stripping effectiveness. As noted previously, advantages are obtained by inclusion of a chlorate ion source even in situations where the alkane sulfonic acid concentration is not reduced, or is reduced only minimally from optimal concentrations in a non-chlorate composition and, hence, the useful range of addition for the chlorate ion source can be as low as 0.1 g/l. More typically, however, the situation is such that the alkane sulfonic acid concentration is substantially reduced, e.g., down to about one-half that in the optimal non-chlorate systems, and in such cases the chlorate ion source concentration typically will be in the range of from about 10 to about 100 g/l in such compositions. As has been noted, compositions in which methane sulfonic acid (MSA) is reduced from 540 g/l 70% MSA to 270 g/l 70% MSA provide essentially equivalent stripping effectiveness to the 540 g/l 70% MSA formulation by inclusion of about 40 g/l sodium chlorate. This exemplary system can be used as a general rule of thumb for determining optimal chlorate ion source concentrations for lesser or greater reductions in alkane sulfonic acid concentration.

For these preferred aqueous solutions of alkane sulfonic acid, ferric nitrate and a source of chlorate, the composition will be free of any appreciable quantities of materials which would affect the basic functionality of the composition, particularly its stripping effectiveness without any significant formation of sludge or precipitate. Generally, then, these preferred compositions will be free of compounds such as thiourea, sodium m-nitrobenzene sulfonate, and the like.

In these preferred compositions of alkane sulfonic acid, ferric nitrate and source of chlorate, nitric acid typically also will be present, generally in concentrations of from about 1 to about 300 g/l. It also will generally be the case that the composition will include inhibitors which minimize any appreciable attack on the underlying copper substrate. Reference should be had to the teachings of U.S. Pat. No. 4,921,571 for suitable inhibitors, which generally are employed at concentrations of from about 0.01% to about 1.0% by weight of the composition. As earlier noted, another advantage of the preferred compositions of this invention, in which otherwise optimal concentrations of alkane sulfonic acid are substantially reduced and particularly when used in reduced temperature operations, is that reduced copper attack is found. This property can be used to advantage either in eliminating the need for inhibitors, reducing the amount of inhibitors, or enabling choice of particular inhibitors (e.g., of very low cost) which might otherwise not be optimally suited for use in an alkane sulfonic acid/ferric nitrate system having normally optimal (high) levels of alkane sulfonic acid.

For employing the preferred aqueous stripping composition to treat tin or solder-coated copper surfaces to remove the tin or solder therefrom, along with any copper-tin film, so as to expose the copper metal, the surfaces in questions are either immersed in the aqueous composition or the composition is sprayed on the surfaces. For typical tin or tin-lead and copper-tin layer thicknesses as earlier described, complete removal generally can be effected after from one to three minutes immersion, or upon spraying for anywhere from about 10 to 30 seconds. For spraying, the aqueous composition is typically continuously recirculated, and of course, for spraying or immersion processes, the aqueous composition can be used to treat a variety of tin- or tin-lead-coated copper surfaces simultaneously or sequentially until it has become exhausted to the point where stripping efficiency becomes uneconomically low. Reference is made to the earlier-noted U.S. Pat. No. 4,944,851 for methods useful in regenerating the stripping composition to recover metal values therefrom and restore optimal stripping effectiveness and capacity.

Generally the preferred aqueous stripping composition can be employed at room temperature, but preferred operation involves somewhat elevated temperatures, e.g., from about 75° to about 120° F. As noted, one of the advantages of these chlorate-containing compositions is that they enable effective operation at temperatures lower than optimally employed in a non-chlorate alkane sulfonic acid/ferric nitrate system.

As noted at the outset, the present invention also provides compositions for stripping of tin or tin-lead from copper surfaces which are characterized by being comprised of aqueous solutions of a source of chlorate ion and an acid effective to solubilize the stripped metals. The preferred composition herein comprised of an aqueous solution of alkane sulfonic acid, ferric nitrate and a source of chlorate ion is thus embraced by, i.e., is a species of, this more fundamentally defined composition, but numerous other compositions are contemplated, such as those comprised of a source of chlorate and solubilizing acids such as acetic, formic and the like, as well as compositions comprised of a source of chlorate ion and an alkane sulfonic acid. Still further, the inclusion of a source of chlorate in other stripping compositions known in the art, such as those based on nitric acid, nitro-substituted aromatic compounds, and the like, also is capable of bringing about advantages in those systems, including potential for reduction in concentration of otherwise expensive components.

The invention is further described and illustrated in the following examples.

EXAMPLE I

An aqueous stripping composition (Control) was prepared containing 540 g/l of 70% methane sulfonic acid, 54 g/l nitric acid (69%), 80 g/l ferric nitrate nonahydrate, and 1.0 g/l inhibitor. The composition was used in the stripping of solder from solder-coated (0.3 mil) copper areas of printed circuit boards, also having an organic resist pattern thereon, by immersion technique (solution temperature 100° F.). Generally, about three (3) minutes was required to strip the solder and expose the underlying copper metal. No precipitate or sludge was evident in the solution even after continued use and dissolution therein of over 150 g/l solder, and the capacity of the solution was determined to be about 21 oz./gal. (157.5 g/l) solder. Undercutting of the organic resist was noted, along with a degree of attack on the copper substrate.

The control formulation was modified by reduction of the 70% methane sulfonic acid to 270 g/l, and increase of the nitric acid concentration to 107.9 g/l, and similarly used to process printed circuit boards. Solder stripping was very ineffective, and the solution capacity was only 6 oz./gal. (45 g/l) solder.

The modified formulation was further modified by inclusion therein of 40 g/l sodium chlorate. Using a solution temperature of 80° F., stripping was highly effective. The solution capacity was 23 oz./gal. (172 g/l) solder, copper attack was about one-third less than that noted with the control, and minimal undercutting of the resist was found.

EXAMPLE II

A composition was prepared containing 400 g/l 70% methane sulfonic acid, 100 g/l sodium chlorate, and water (balance to one liter) and employed, at 90° F. solution temperature, to strip solder from solder-coated copper areas of printed circuit boards, as in Example I.

The solution stripped well to a capacity of 12 oz./gal. solder, with minimal copper attack (about 8-10 microinches per minutes) and no sludge formation. Similar results were obtained at a solution temperature of 95° F. For printed circuit boards also containing organic resist, solder stripping occurred without attack of the resist.

The foregoing description and examples are provided in illustration of the invention and its preferred embodiments, as well as particular features and preferred materials, concentrations and conditions, and are not intended to constitute limitations of the scope of the invention except to the extent as noted in the appended claims.

What is claimed is:

1. A composition for stripping tin or tin-lead alloy, and any underlying copper-tin alloy, from a copper surface, without bringing about significant formation of sludge, precipitate or suspended by-products, comprising an aqueous solution of an alkane sulfonic acid, ferric nitrate and a solution-soluble source of chlorate ion, each in amounts such that the composition is effective to strip said tin or tin-lead alloy, and any underlying copper-tin alloy, from said copper surface without bringing about significant formation of sludge, precipitate or suspended by-products.

2. A composition according to claim 1 wherein said alkane sulfonic acid is present in said aqueous solution in an amount of from about 10 to about 1500 g/l, said ferric nitrate is present in said aqueous solution in an amount of from about 1 g/l to saturation, and, wherein said source of chlorate ion is present in said aqueous solution in an amount of from about 0.1 g/l to saturation.

3. A composition according to claim 2 wherein the amount of alkane sulfonic acid in said aqueous solution is less than about 500 g/l.

4. A composition according to claim 1 consisting essentially of alkane sulfonic acid, ferric nitrate and solution-soluble chlorate.

5. A composition according to claim 4 further containing nitric acid.

6. A composition according to claim 1 wherein said alkane sulfonic acid is methane sulfonic acid.

7. A composition according to claim 1 wherein said source of chlorate ion is sodium chlorate.

8. A composition for stripping tin or tin-lead alloy, and any underlying copper-tin alloy, from a copper surface, consisting essentially of an aqueous solution of methane sulfonic acid, ferric nitrate, sodium chlorate and nitric acid, each in amounts such that the composition is effective to strip said tin or tin-lead alloy, and any underlying copper-tin alloy, from said copper surface, without bringing about substantial formation of sludge, precipitate or suspended by products.

9. A composition according to claim 8 wherein the amount of said alkane sulfonic acid in said aqueous solution is less than about 500 g/l.

10. A method for stripping tin or tin-lead alloy, and any underlying copper-tin alloy, from a copper surface, comprising contacting said surface with a composition comprising an aqueous solution of an alkane sulfonic acid, ferric nitrate and a solution-soluble source of chlorate ion, each present in said composition in amounts such that the composition is effective for said stripping without bringing about substantial formation of sludge, precipitate or suspended by-products, for a time and at a temperature effective to bring about said stripping.

11. A method according to claim 10 wherein said composition contains from about 10 to about 1500 g/l alkane sulfonic acid, from about 1 g/l to saturation ferric nitrate, and from about 0.1 g/l to saturation source of chlorate ion.

12. A method according to claim 11 wherein said composition contains less than about 500 g/l alkane sulfonic acid.

13. A method according to claim 12 wherein said composition further comprises nitric acid.

14. A method according to claim 10 wherein said composition consists essentially of an aqueous solution of methane sulfonic acid, ferric nitrate, sodium chlorate and nitric acid.

15. A method according to claim 10 wherein said temperature is less than about 120° F.

16. A method according to claim 10 wherein said copper surface is a copper surface of a printed circuit board, and wherein said printed circuit board further contains a patterned organic resist thereon.

17. A method according to claim 10 wherein said contacting is selected from the group consisting of immersing said surface in said solution and spraying said solution on said surface.

18. A composition for stripping tin or tin-lead alloy from a copper surface, comprising an aqueous solution of a solution-soluble source of chlorate ion and an acid effective to solubilize tin or tin-lead stripped from said surface.

19. A composition according to claim 18 wherein said solubilizing acid is an organic acid.

20. A composition according to claim 19 wherein said organic acid is selected from the group consisting of acetic acid and formic acid.

21. A composition according to claim 18 wherein said solubilizing acid is an alkane sulfonic acid.

22. A composition according to claim 18 consisting essentially of an aqueous solution of sodium chlorate and methane sulfonic acid.

* * * * *